US006977184B1

(12) United States Patent
Chou et al.

(10) Patent No.: US 6,977,184 B1
(45) Date of Patent: Dec. 20, 2005

(54) METHOD AND APPARATUS FOR NITRIDE SPACER ETCH PROCESS IMPLEMENTING IN SITU INTERFEROMETRY ENDPOINT DETECTION AND NON-INTERFEROMETRY ENDPOINT MONITORING

(75) Inventors: Wen-Ben Chou, Palo Alto, CA (US); Shih-Yuan Cheng, Foster City, CA (US); Wayne Tu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 4 days.

(21) Appl. No.: 09/998,858

(22) Filed: Oct. 31, 2001

(51) Int. Cl.$^7$ .......................................... H01L 21/302
(52) U.S. Cl. ................................... 438/9; 438/724
(58) Field of Search ............................ 438/8, 9, 706, 438/710, 712, 714, 724

(56) References Cited

U.S. PATENT DOCUMENTS

| | | | | |
|---|---|---|---|---|
| 4,618,262 A | * | 10/1986 | Maydan et al. ............ 356/504 |
| 5,372,673 A | * | 12/1994 | Stager et al. .................. 438/8 |
| 5,741,396 A | * | 4/1998 | Loewenstein ............... 438/724 |
| 5,756,216 A | | 5/1998 | Becker et al. .............. 428/446 |
| 5,912,188 A | * | 6/1999 | Gardner et al. ............ 438/740 |
| 5,968,844 A | * | 10/1999 | Keller ......................... 438/695 |
| 6,051,504 A | * | 4/2000 | Armacost et al. .......... 438/706 |
| 6,122,050 A | * | 9/2000 | Rutzke ........................ 356/316 |
| 6,180,535 B1 | | 1/2001 | Wu et al. .................... 438/734 |
| 6,207,544 B1 | * | 3/2001 | Nguyen et al. ............. 438/595 |
| 6,225,203 B1 | | 5/2001 | Liu et al. .................... 438/595 |
| 6,228,277 B1 | | 5/2001 | Kornblit et al. .............. 216/60 |
| 6,277,700 B1 | * | 8/2001 | Yu et al. ..................... 438/303 |
| 6,333,271 B1 | * | 12/2001 | Chiu et al. .................. 438/706 |
| 6,635,185 B2 | * | 10/2003 | Demmin et al. .............. 216/64 |
| 2001/0009245 A1 | | 7/2001 | Allen, III ....................... 216/2 |

* cited by examiner

*Primary Examiner*—Kin-Chan Chen
(74) *Attorney, Agent, or Firm*—Martine Penilla & Gencarella LLP

(57) ABSTRACT

A method for fabricating a spacer of a gate structure is provided. The method performing a first etch process implementing a first etchant gas. The first etch process is configured to implement an interferometry endpoint (IEP) detection method to detect a removal of a portion of a spacer layer having a specific thickness from over the surface of the substrate, thus leaving a thin spacer layer. The method further includes performing a second etch process for a predetermined period of time implementing a second etchant gas. The second etch process is configured to remove the thin spacer layer, leaving the spacer for the gate structure.

18 Claims, 10 Drawing Sheets

METHOD AND APPARATUS FOR NITRIDE SPACER ETCH PROCESS IMPLEMENTING IN SITU INTERFEROMETRY ENDPOINT DETECTION AND NON-INTERFEROMETRY ENDPOINT MONITORING

BACKGROUND OF THE INVENTION

1. Field of the Invention

The present invention relates generally to the fabrication of semiconductor devices and, more particularly, to improving the fabrication of spacers by enhancing the etch endpoint detection of a nitride layer.

2. Description of the Related Art

As is well known, the semiconductor manufacturing process involves several stages during which millions of transistors including source/drain diffusion regions, a conductive polysilicon gate, and a dielectric gate oxide are fabricated on a single semiconductor chip. One of such fabrication stages is the silicon nitride spacer etch process during which a conformal layer of silicon nitride is deposited on a surface of the substrate having fabricated transistors. This silicon nitride layer is subsequently etched utilizing a plasma etch process, creating silicon nitride spacers alongside the polysilicon gates.

As the demand for scaling down the integrated devices and thus feature sizes such as spacers is continuously increasing, so is the need for implementing a more controllable etch process. However, this need is specifically more pronounced during the one step silicon nitride spacer etch process as the aggressive nature of the etch chemistry implemented inevitably results in gate oxide punch through leading to changes in gate oxide dimensions. As is well known, changes to the gate oxide are disfavored since they modify the electrical conductivity of the gate oxide and thus the transistor.

Predominantly, the silicon nitride layer is removed through implementing a one-step plasma etching method (e.g., dry etching). The plasma etching process is typically performed in a plasma chamber in which strong electrical fields cause high energy gases containing positively charged ions and negatively charged electrons to be accelerated toward the exposed surface of the silicon nitride layer. During the one-step plasma etching process, the exposed layer of silicon nitride is chemically and physically removed as a result of being bombarded with positive ions.

Preferably, the one-step etching process of the silicon nitride layer must stop once it has been determined that the silicon nitride material has been etched through and removed from over the surface of the substrate. Additionally, this one-step etch process must be achieved without damaging the underlying layer. Consequently, to accommodate this goal, it is imperative to implement an endpoint detection method capable of stopping the one-step etch process once the silicon nitride layer has been etched through.

Thus far, optical emission spectroscopy (OES) method has been primarily utilized for detecting the etch endpoint. In this method, the light emitted by the gases within the etch reactant chamber is used to identify the specific material being etched. As the light emission intensity is directly proportional to the concentration of a specific gas within the etch reactant chamber, the endpoint detector can in theory determine when the etching of the silicon nitride material has concluded.

Thus far, however, the OES method has proven to be less than reliable and efficient etch endpoint detection as it causes the overetching or underetching of the silicon nitride layer, rendering the outcome of the one-step etch process unpredictable. Specifically, this occurs due to the variation in thickness of the silicon nitride layers between wafers of the same lot as well as the wafers of different lots. For instance, the overetching of the silicon nitride layer during the one-step etch process using the predominantly used aggressive chemistry causes the removal of portions of the gate oxide or ultimately, in gate oxide punch through.

Unfortunately, the unreliability and unpredictability associated with the OES method has a severe negative impact on fabrication stages and thus semiconductor manufacturing. Among others, the unpredictability mandates the close monitoring of the one-step etch process, multiple inspections of the semiconductor substrate during the one-step etching operation, necessity to recalibrate the tools for each substrate within the same lot as well as different lots, thus needlessly wasting valuable time, slowing down the production, yield loss, and ultimately semiconductor substrate throughput.

In view of the foregoing, a need exists for a spacer etch endpoint detection methodology and apparatus that eliminates the unpredictability and unreliability associated with the conventional optical emission spectroscopy (OES) etch endpoint detection method used during the one-step etch process while increasing semiconductor substrate throughput.

SUMMARY OF THE INVENTION

Broadly speaking, the present invention fills these needs by providing an apparatus and methodology for fabricating nitride spacers utilizing an in-situ two-step etch process capable of substantially precisely controlling the etch process as well as the shape of the nitride spacers. In one preferred embodiment, the nitride spacers are fabricated by performing a main etch process on a nitride spacer layer using the interferometry endpoint detection method. The main etch process is then followed by an overetch process wherein the thin layer of nitride spacer is etched. In one embodiment, the thin layer of nitride spacer is etched implementing a time mode etch method utilizing a highly selective etch chemistry. In another example, the overetch process is a timed-etch method implementing a non-IEP etch endpoint detection method to monitor the process parameters. In one embodiment, the non-IEP etch endpoint detection method configured to monitor the process parameters is optical emission spectroscopy (OES) implementing a highly selective etch chemistry.

It should be appreciated that the present invention can be implemented in numerous ways, including as a process, an apparatus, a system, a device, or a method. Several inventive embodiments of the present invention are described below.

In one embodiment, a method for fabricating a spacer of a gate structure is disclosed. The method includes performing a first etch process implementing a first etchant gas. The first etch process is designed to implement an interferometry endpoint (IEP) detection method to detect the removal of a portion of a spacer layer. Further included in the method is discontinuing the first etch process upon removing the portion of the spacer layer, thus leaving a thin spacer layer. The method also includes performing a second etch process implementing a second etchant gas to remove the thin spacer layer. Also included is discontinuing the second etch process when the second etch process has continued for a predetermined period of time. The second etch process is configured to remove the thin spacer layer, leaving the spacer for the gate structure.

In another embodiment, a method for fabricating a spacer of a gate structure is disclosed. The method includes performing a first etch process implementing a first etchant gas. The first etch process is configured to implement an interferometry endpoint (IEP) detection method to detect a removal of a portion of a spacer layer having a specific thickness from over the surface of the substrate, thus leaving a thin spacer layer. The method further includes performing a second etch process for a predetermined period of time implementing a second etchant gas. The second etch process is configured to remove the thin spacer layer, leaving the spacer for the gate structure.

In still another embodiment, a method for forming a silicon nitride spacer is disclosed. The method includes depositing a silicon nitride spacer layer over a substrate having a gate structure formed thereon. Also included is performing a first etch operation on the silicon nitride spacer layer in a plasma chamber and monitoring a light reflected by the silicon nitride spacer layer. The method further includes stopping the first etch operation so as to leave a thin spacer layer over the surface of the substrate and the gate structure formed thereon. Also included are purging a first plasma content defined within the plasma chamber and performing a second etch operation in the plasma chamber. The second etch operation is configured to remove the thin spacer layer. The method further includes monitoring an optical signal produced by a second plasma during the second etch operation and discontinuing the second etch operation once the second etch operation has continued for a predetermined period of time. The first etch operation and the second etch operation are performed in situ so as to control a shape of nitride spacers and a removal of the spacer layer.

In yet another embodiment, an in situ dual-stage etch endpoint detection system is disclosed. The system includes an etch chamber, an interferometry endpoint monitoring system, and a non-IEP endpoint monitoring system. The etch chamber is configured to include an electrostatic chuck (ESC), a top electrode, and a bottom electrode. The ESC is designed to support a wafer having a spacer layer formed over a gate structure. The interferometry endpoint (IEP) monitoring system is designed to monitor an interference photon beam reflected by the top of spacer layer and the reflection beam on interface of bottom of spacer during a first etch operation. The non-IEP endpoint monitoring system is configured to monitor a second etch operation by monitoring an etch time. A first etch operation implementing the IEP monitoring system is configured to be discontinued, leaving a thin spacer layer to be etched during the second etch operation.

The advantages of the present invention are numerous. Most notably, the embodiments of the present invention are configured to perform the spacer etch process in two stages, in situ. Another advantage of the present invention is that the nitride spacer etch process can precisely control the etch endpoint as well as the shape of the spacers. Yet another benefit of the present invention is that the two-step in situ spacer etch process of the present invention can be used to accurately etch spacer layers having different thickness, thus reducing defects in wafers and increasing throughput. Still another advantage of the present invention is that the two-step in situ spacer etch process increases tool reliability and production yield.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention for increasing wafer throughput through implementing an in-situ two-step etch process, is disclosed. Preferably, the in-situ two-step etch processes is used to etch a nitride (i.e., silicon nitride) spacer layer formed over a semiconductor substrate having a plurality of gate structures. During the first stage, an interferometry endpoint (IEP) system is implemented to detect the etch endpoint during a main etch process. Subsequently, an overetch process is performed. Preferably, the main etch process removes an etch depth of the nitride spacer layer leaving a thin layer of nitride. Thereafter, the remaining thin layer of nitride is removed in an overetch process. In one example, the etch depth is measured by implementing a distance between adjacent maximum or minimum fringes of a particular endpoint detection wavelength. In one embodiment, the thin layer of nitride is removed in the overetch process implementing the timed-etch method. In another example, the timed-etch overetch process can be monitored by optical emission spectroscopy (OES) implementing a highly selective etch chemistry.

Figure 1:
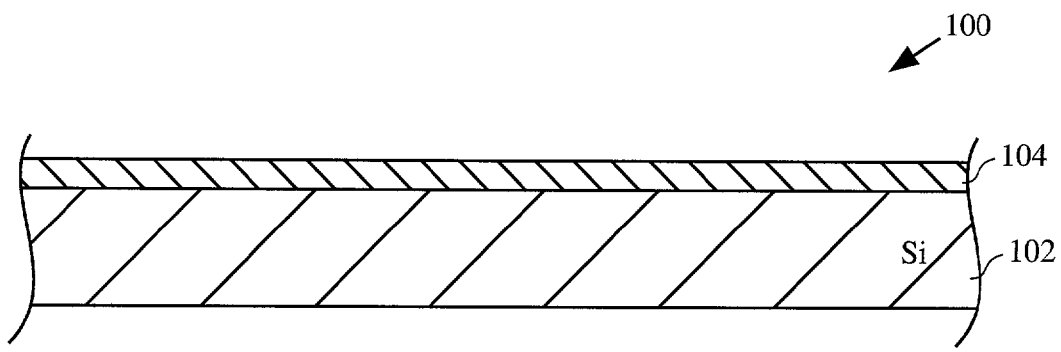
FIG. 1 is a simplified cross sectional view of a semiconductor wafer having a gate oxide layer formed over a substrate, in accordance with one embodiment of the present invention.

FIG. 1 depicts a semiconductor wafer 100 having a gate oxide layer 104 formed over a substrate 102, in accordance with one embodiment of the present invention. Although not shown, the substrate 102 is configured to include a plurality of transistors, each of which is configured to include source/drain diffusion regions. In one example, the substrate 102 is made out of a silicon material, allowing the gate oxide layer 104 to be thermally grown implementing an oxidation furnace. For instance, the substrate 102 is inserted into the oxidation furnace exposing the substrate 102 to oxygen, causing a substantially thin layer of oxide to be grown on the surface of the substrate 102. By way of example, the thickness of the gate oxide layer 104 is configured to range from approximately about 100 Å to about 200 Å, and more preferably from approximately 20 Å to about 150 Å. The preferred thickness of the gate oxide is approximately about 90 Å.

Figure 2:
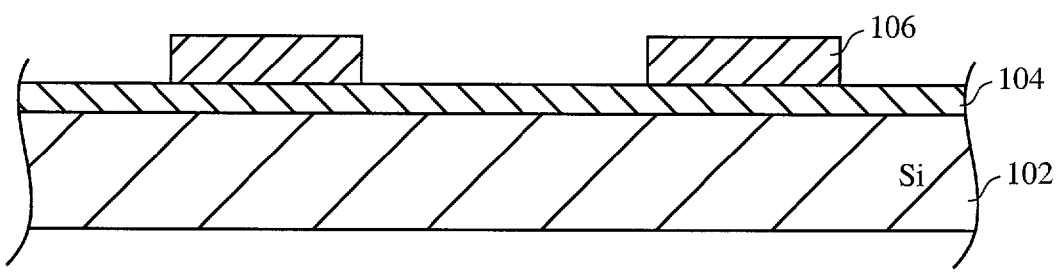
FIG. 2 is a simplified cross sectional view of the wafer shown in FIG. 1, subsequent to forming of a plurality of polysilicon gates over the gate oxide layer, in accordance with one embodiment of the present invention.

FIG. 2 shows the wafer 100 subsequent forming of a plurality of polysilicon gates 106 over the gate oxide layer 104, in accordance with one embodiment of the present invention. In one implementation, the polysilicon gates 106 are formed over the gate oxide layer 104 by first depositing a layer of polysilicon over the grown gate oxide layer 104. Thereafter, the polysilicon gates 106 are formed by first photorsesit patterning over the polysilicon gate material and thereafter plasma etching the polysilicon material to define the polysilicon gates 106. As it is desirable to maintain the width of the polysilicon gates 106 substantially the same during the fabrication process, it is important to perform the fabrication operations such that they will have substantially no effect on the width of the polysilicon gates 106.

Figure 3:
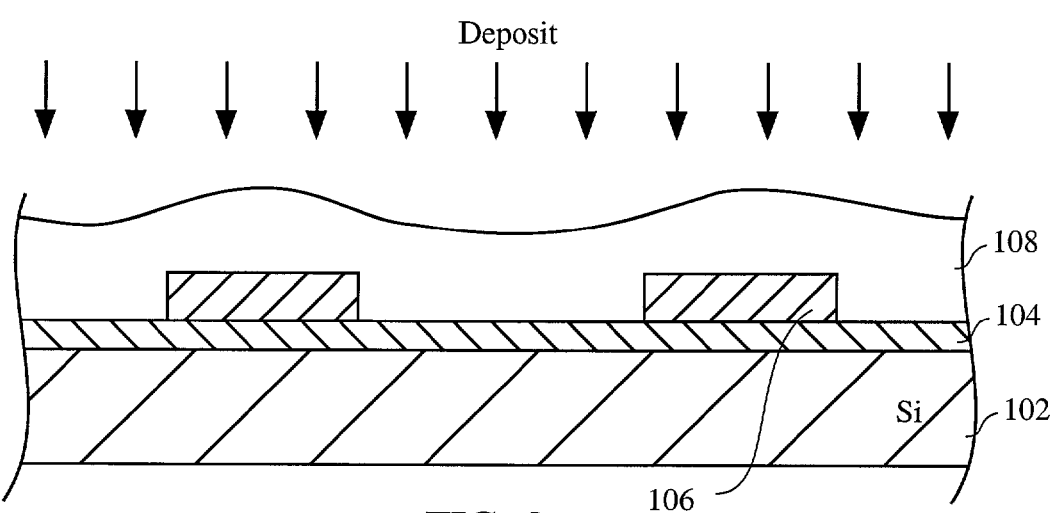
FIG. 3 is a simplified cross sectional view illustrating a deposition of a spacer layer 108 over the previously formed polysilicon gates, in accordance with one embodiment of the present invention.

Referring to FIG. 3, a deposition of a spacer layer 108 over the previously formed polysilicon gates 106 can further be understood, in accordance with one embodiment of the present invention. In one example, the spacer layer 108 is a conformal, and is formed by depositing a nitride material implementing a chemical vapor deposition (CVD) process. In accordance with one embodiment of the present invention, the nitride material is silicon nitride. By way of example, the thickness of the spacer layer 108 is configured to range from approximately about 400 Å to about 1200 Å, and more preferably from approximately 500 Å to about 1000 Å. The preferred thickness of the spacer layer is configured to be approximately about 1000 Å.

Figure 4A:
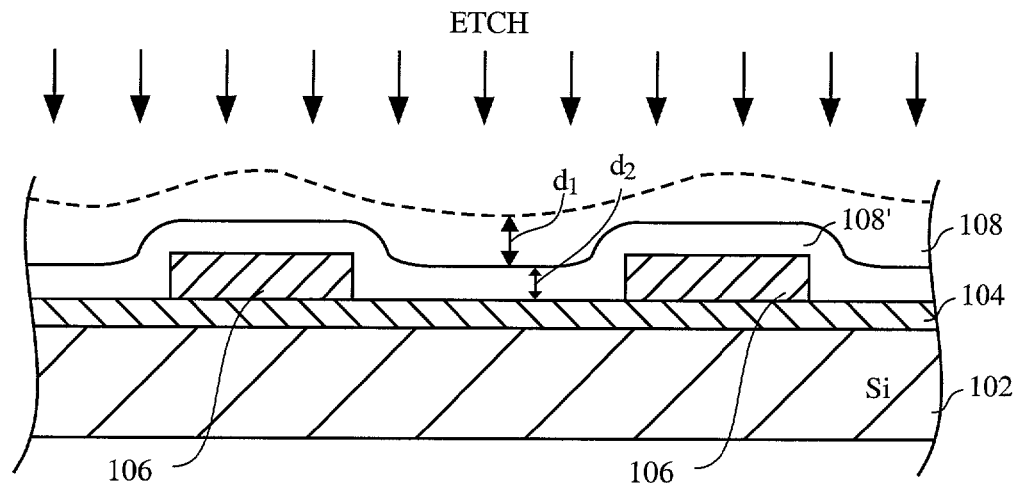
FIG. 4A is a simplified cross sectional view illustration the main etch operation during which a bulk of the spacer layer 108 is etched implementing a substantially aggressive etch rate using the IEP etch endpoint detection method, in accordance with still another embodiment of the present invention.

FIG. 4A depicts the main etch operation during which a bulk of the spacer layer 108 is etched implementing a substantially aggressive etch rate utilizing IEP as the etch endpoint detection method, in accordance with one embodiment of the present invention. As shown, subsequent to the main etch operation, a substantially thin layer 108' of the spacer layer 108 having a thickness d2 remaining. As will be explained in more detail below with respect to FIGS. 4B–4E, the IEP detection method can be implemented to determine a depth d2 of spacer layer 108 subsequent the main etch operation. In this manner, the IEP detection method is implemented to almost precisely control the end point of the main etch process, thus allowing the implementation of a more aggressive etch operation. As a result, in the embodiments of the present invention, the main etch process is formulated so as to function as a substantially aggressive etch process. In one embodiment, the thickness d2 of the thin layer of spacer layer 108 is configured to be from approximately about 50 Å to approximately about 300 Å, and preferably ranging from approximately about 100 Å to 200 Å, and preferably approximately about 100 Å.

Figure 4B:
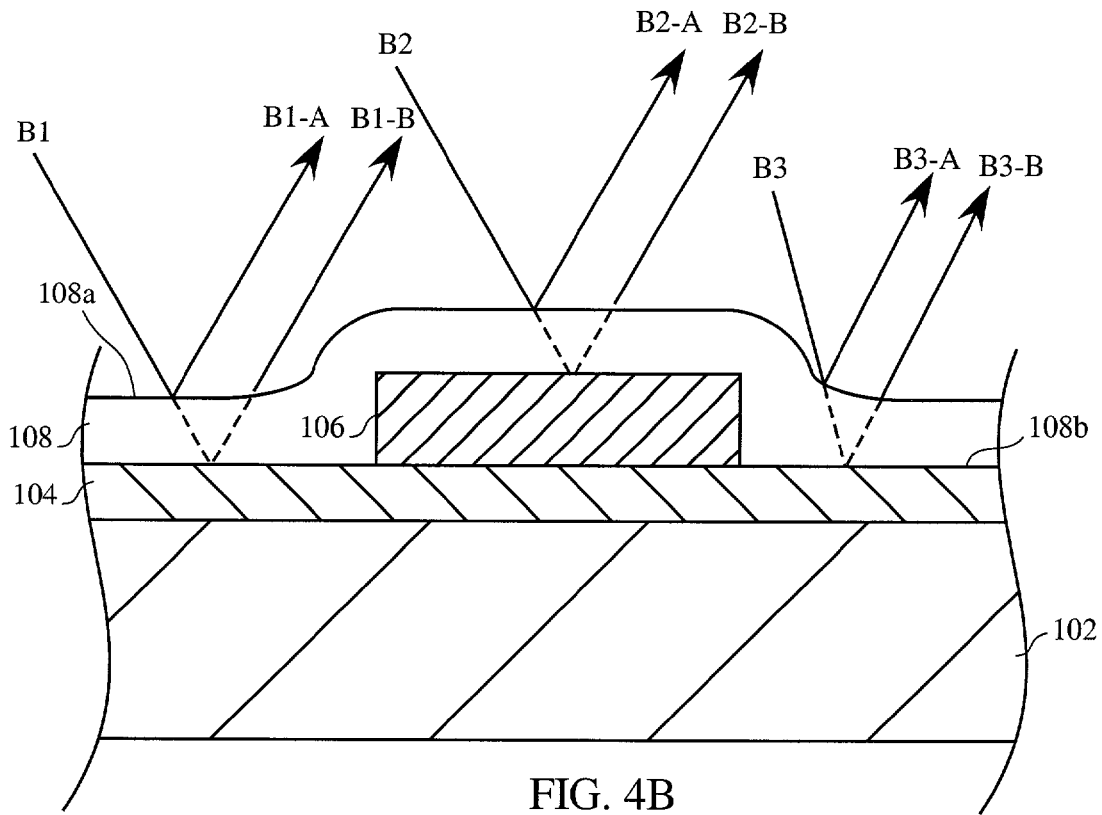
FIG. 4B is a simplified, exploded, cross sectional view illustrating the use of interferometry to detect the end point of the main etch process, in accordance with still another embodiment of the present invention.

The use of interferometry to detect the end point of the main etch process can further be understood in reference to FIG. 4B, in accordance with one embodiment of the present invention. As used herein, "interferometry" is described as implementing a photodetector to detect a reflected portion of a beam of photons having a wavelength as the beam of photons is directed onto a surface of a layer to be etched. A plurality of beams B1, B2, and B3 have been directed toward the layer to be etched, the spacer layer 108. As shown, certain portions of the beams B1, B2, and B3 directed to the spacer layer 108 are reflected by the upper surface 108a of the spacer layer 108 creating beams B1-a, B2-a, and B3-a, respectively. However, as illustrated, some portions of the beams B1, B2, and B3 are reflected by a lower surface 108b of the spacer layer 108, creating beams B1-b, B2-b, and B3-b, respectively. The reflected beams B1-a and B1-b, or B2-a and B2-b, or B3-a and B3-b optically interfere creating maximum intensity and minimum intensity fringes. As the main etch operation proceeds and the thickness of the spacer layer 108 decreases, the intensity of the reflected beams B1-a and B1-b, or B2-a and B2-b, or B3-a and B3-b (i.e., any individual pair of beams) cycles sinusoidally over time. That is, a distance is created between adjacent maximum or minimum fringes, which can be used to measure a thickness of the material removed at a given time. For instance, in accordance with one embodiment of the present invention, the etch depth d1 of the main etch process is calculated by counting a specific number of interference fringes at a particular wavelength.

Figure 4C:
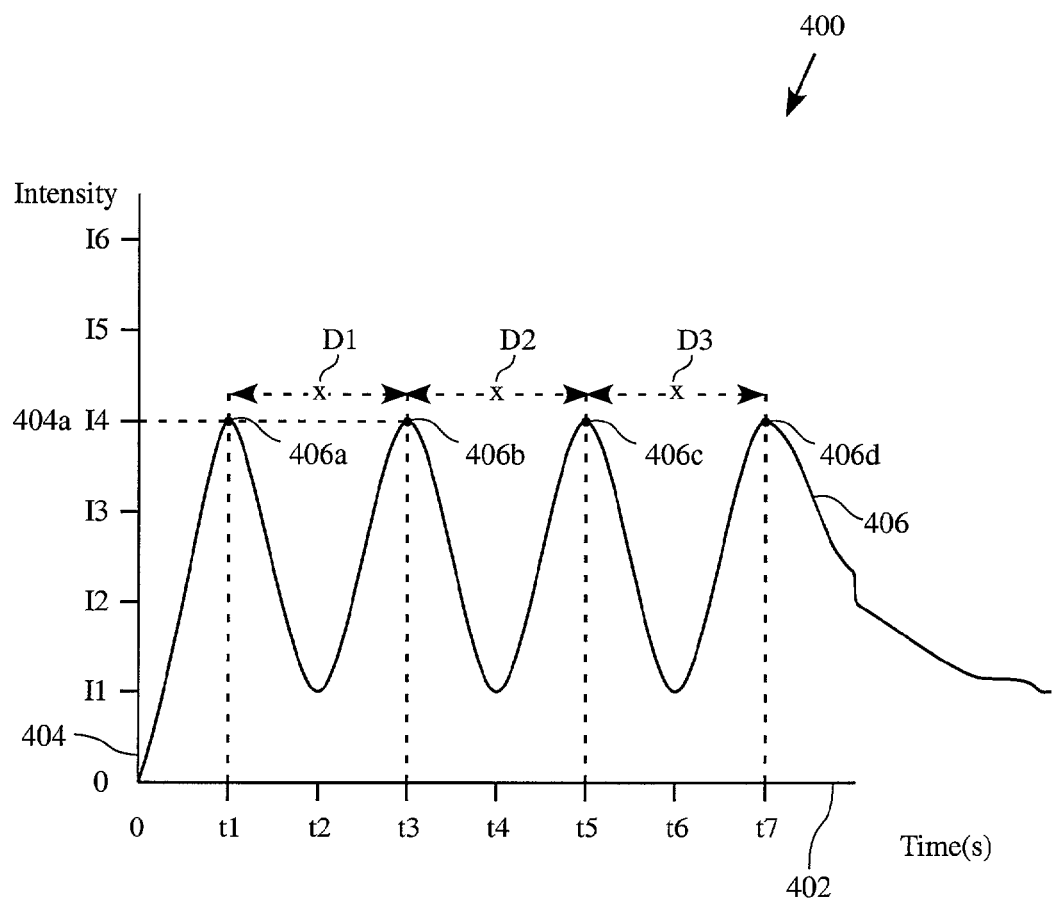
FIG. 4C illustrates a sinusoidal graph, tracing the intensity of a reflected interference beam vs. etch time, in accordance with still another embodiment of the present invention.

The calculating of the etch depth d1 through counting interference fringes can further be understood with respect to a sinusoidal graph 406 of a plot 400 tracing the intensity of the reflected interference beams B1-a and B1-b vs. etch time of FIG. 4C, in accordance with one embodiment of the present invention. As shown, the graph 400 illustrates the changes in the intensity (i.e., y-axis 404a) of the reflected beams B1-a and B1-b as the etch operation proceeds (i.e., x-axis 402). A plurality of maximum interference fringes 406a, 406b, 406c, and 406d each correspond to an intensity I4 at times t1, t3, t5, and t7, respectively. As illustrated, a distance D1 between the two adjacent maximum fringes 406a and 406b, a distance D2 between the two adjacent maximum fringes 406b and 406c, and the distance D3 between the adjacent maximum fringes 406c and 406d each equivalent to x. In this manner, if desired, the main etch operation can be seized when any of the maximum fringes 406b, 406c, or 406d is detected as each corresponds to the removal of a distance x, 2X, or 3X of the spacer layer 108. Thus, beneficially, the IEP detection method can be used to halt the etching operation before an opportunity to punch through the polysilicon gate arises, thus reducing the number of defective devices.

Figure 4D:
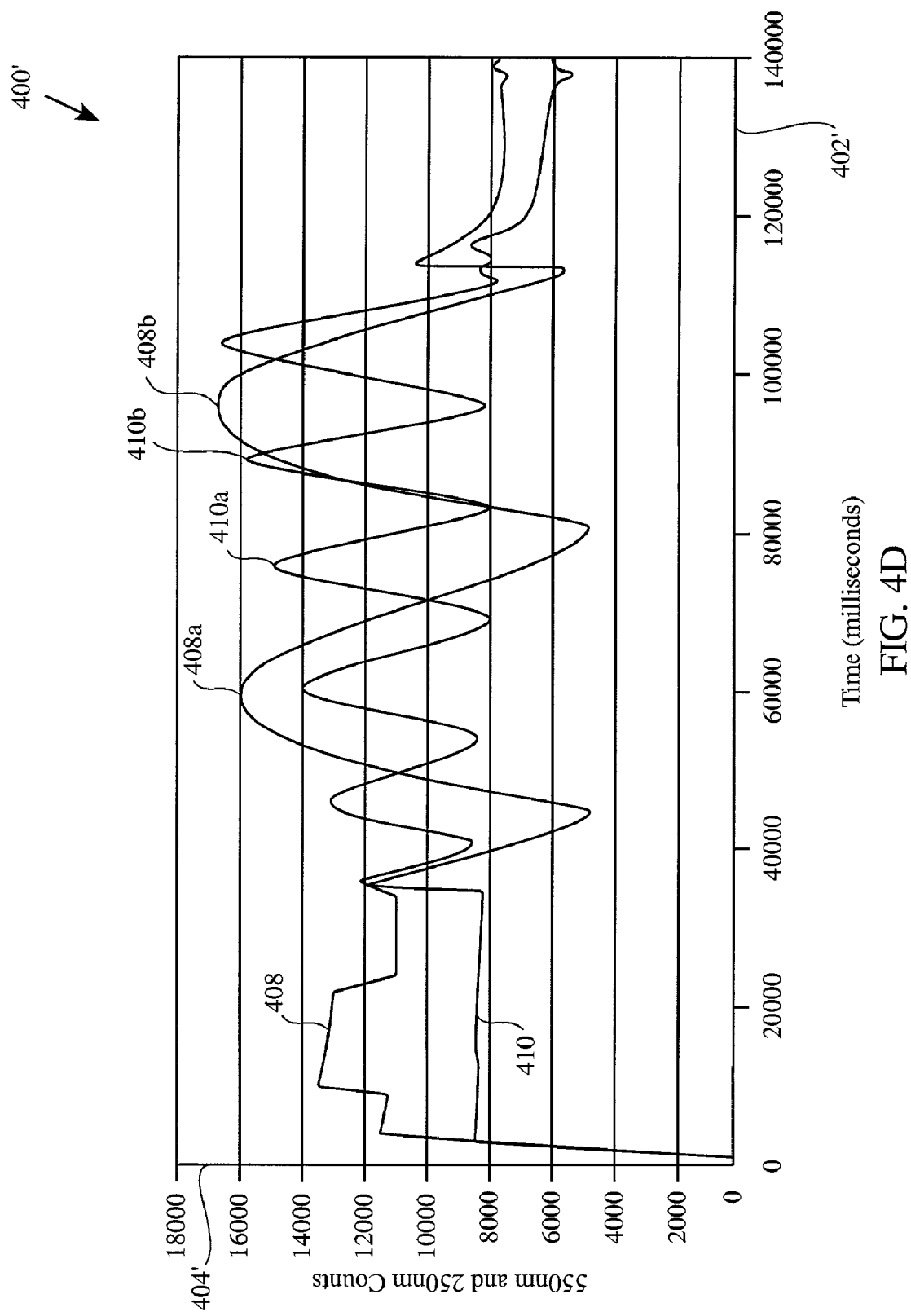
FIG. 4D illustrates a graph illustrating the seizing of the spacer layer main etch operation upon reaching a desired etch depth, in accordance with still another embodiment of the present invention.

Discontinuing the main etch operation of the spacer layer 108 upon reaching a desired etch depth, leaving a thin layer of spacer layer 108 can further be understood with respect to graphs 408 and 410 of a plot 400' of FIG. 4D, in accordance with one embodiment of the present invention. As shown, the plot illustrates the changes in the intensity of the reflected light beams (y-axis 404') as the etch operation proceeds (x-axis 402'). Specifically, the graph 408 depicts the intensity vs. time changes of the light beam at wavelength 550 nm while the graph 410 illustrates same for the wavelength 250 nm as the spacer layer 108 is etched. For each illustrated wavelength, the main etch operation implementing the IEP etch endpoint detection method was initiated at about time 0 and intensity 0 and was interrupted at time about 120,000 milliseconds. As illustrated a greater time interval between the two adjacent maximum fringes 408a and 408b of the graph 408 having the longer wavelength 550 nm can be detected. In contrast, a shorter time interval between the two adjacent maximum fringes 410a and 410b of the graph 410 having the shorter wavelength 250 nm can be depicted.

It must be noted that the main etch operation of the spacer layer 108 can be interrupted at a desired etch depth leaving a thin spacer layer, irrespective of the wavelength of the light beam and the number of adjacent fringes. By way of example, the etch depth can be determined according to a relation $2d=N(\lambda/n)$ wherein d is the thickness of the layer along the path of the beam (e.g., the spacer layer 108), $\lambda$ being the wavelength of the photon beam, n being the refractive index of the layer along the photon path, N being the number of fringe count. Thus, when performing the main etch operation of the spacer layer 108, the distance between the two adjacent maximum fringes 408a and 408b at wavelength 550 nm is approximately about 112 nm (n=2.04 for nitride, N=1) thickness of nitride, while the distance between the two adjacent maximum fringes 410a and 410b at wavelength 250 is approximately about 62 nm. Thus, as illustrated, the greater the wavelength of a photon beam, the greater is the distance between the adjacent maximum fringes. In this manner, the number of sinusoidal cycles required to successfully achieve the main etch operation varies depending on the wavelength of photon beams implemented. That is, where the wavelength is greater the fewer sinusoidal cycles are observed as opposed to the lower wavelength where greater number of sinusoidal cycles can be detected. In accordance to one embodiment, the short wavelength allows better control of remaining thickness at IEP endpoint.

Figure 4E:
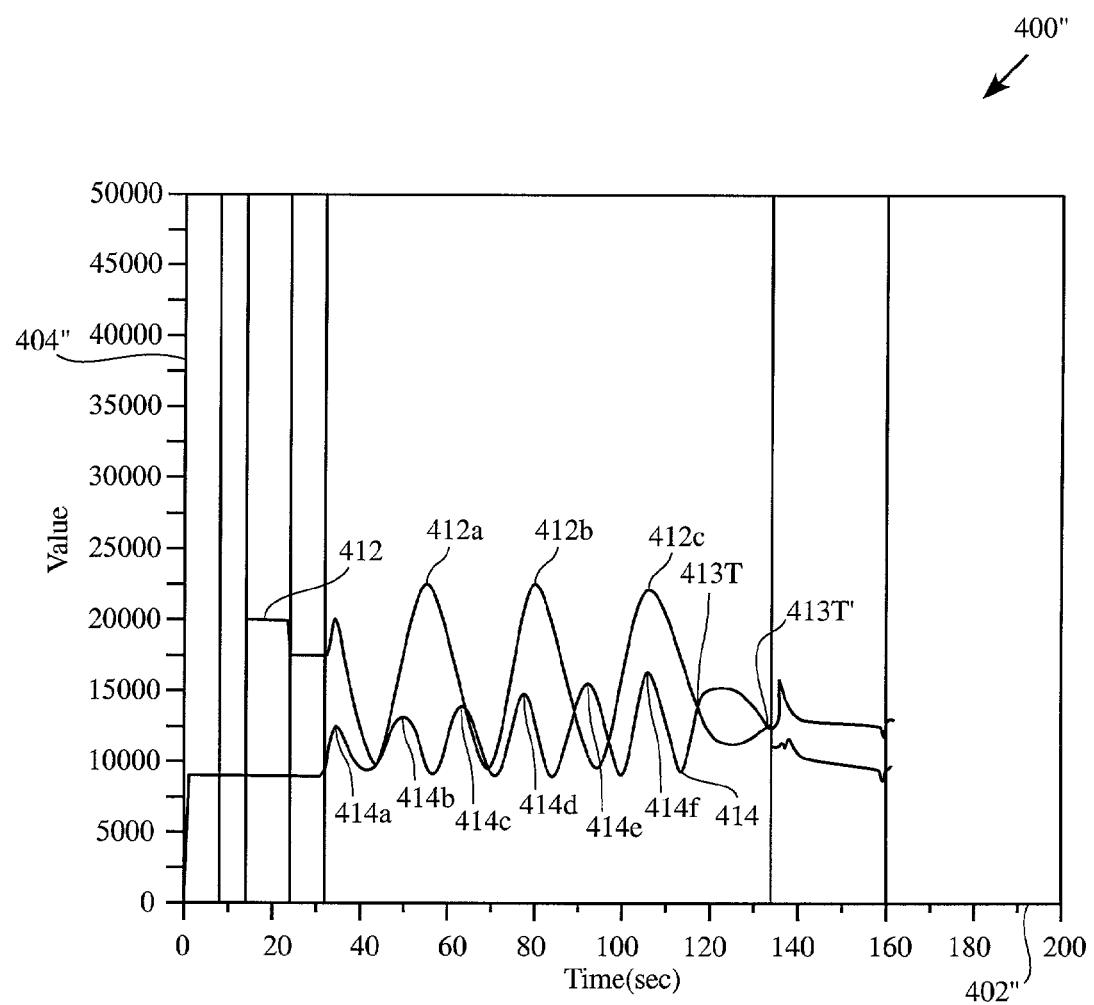
FIG. 4E illustrates a graph tracing a one-step spacer layer etch operation extended pass the desired thickness implementing the IEP etch endpoint detection, in accordance with still another embodiment of the present invention.

In contrast to the plot 400' in which the etching of the spacer layer 108 has been stopped by implementing the IEP endpoint detection control, graphs 412 and 414 of a plot 400'' of FIG. 4E illustrate the IEP etch endpoint signal if the main etch process has passed the spacer layer 108 endpoint, in accordance with one embodiment of the present invention. As shown, the graph 412 having the wavelength 400 nm has a plurality of maximum fringes 412a, 412b, and 412c while the graph 414 having the wavelength 250 nm has a plurality of maximum fringes 414a through 414f. As shown, graphs 412 and 414 have met at a point 413t and 413t' of graphs 412 and 414. As shown, the formation of the loops between the points 413t and 413t' creating an abruption of the sinusidal cycle, signaling the conclusion of the etch operation. Thus, in this manner, advantageously, the sinusoidal cycles detected by the IEP detection method are used to monitor the main etch operation, allowing the implementation of a substantially aggressive etch rate, enabling the interruption of the main etch operation prior to reaching the underlying layer.

Figure 5A:
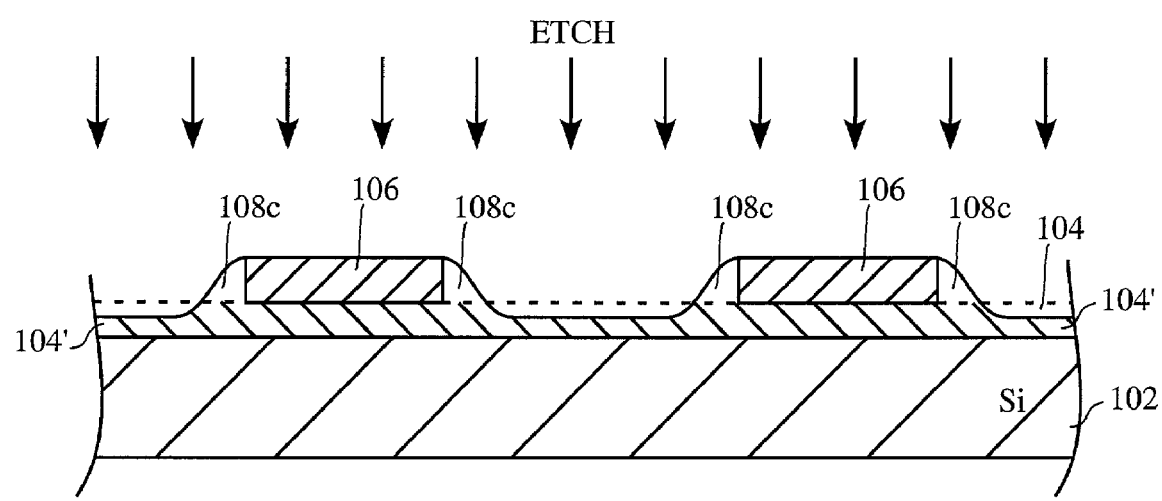
FIG. 5A is a simplified cross sectional view of depicting the formation of spacers along sidewalls of the polysilicon gates subsequent to a second etch operation implementing the OES etch endpoint detection method, in accordance with yet another embodiment of the present invention.

FIG. 5A depicts the formation of spacers 108c along sidewalls of the gates 106 subsequent to an overetch process (i.e., the second etch operation) directed toward removing a substantially thin layer 108', in accordance with one embodiment of the present invention. In one example, the overetch process is a time mode etch operation. In another example, the overetch process implementing the time mode etch method can be monitored with OES. During this etching operation, the thin layer of spacer layer 108' (i.e., over etch layer) 108' is removed implementing an etch chemistry having a substantially high selectivity. As used herein, high selectivity is defined as the high rate of removal of the spacer layer 108' versus the removal rate of the underlying material (e.g., oxide). In one exemplary implementation, as shown in the embodiment of FIG. 5A, a portion of the underlying gate oxide layer 104 is also removed during the overetch operation despite the high selectivity of the etchant chemistry toward polysilicon and oxide. As a result, subsequent to the overetch operation, a gate oxide layer 104' having a thickness less than the gate oxide layer 104 will remain.

Specifically, the overetch operation is carried on for a predetermined period of time. In one example, the overetch process is carried on between approximately about 10" and approximately about 150", and preferably between approximately about 20 and 130", and more preferably about 50". In one embodiment, the OES can be implemented to monitor the overetch operation. For instance, as the etching of the thin spacer layer 108' proceeds, the etchant molecules as well as the spacer material within the etch chamber continuously emit a signal. However, as the overetch operation continues and as the predetermined time approaches, the light emission changes signaling the conclusion of the overetch operation.

Figure 5B:
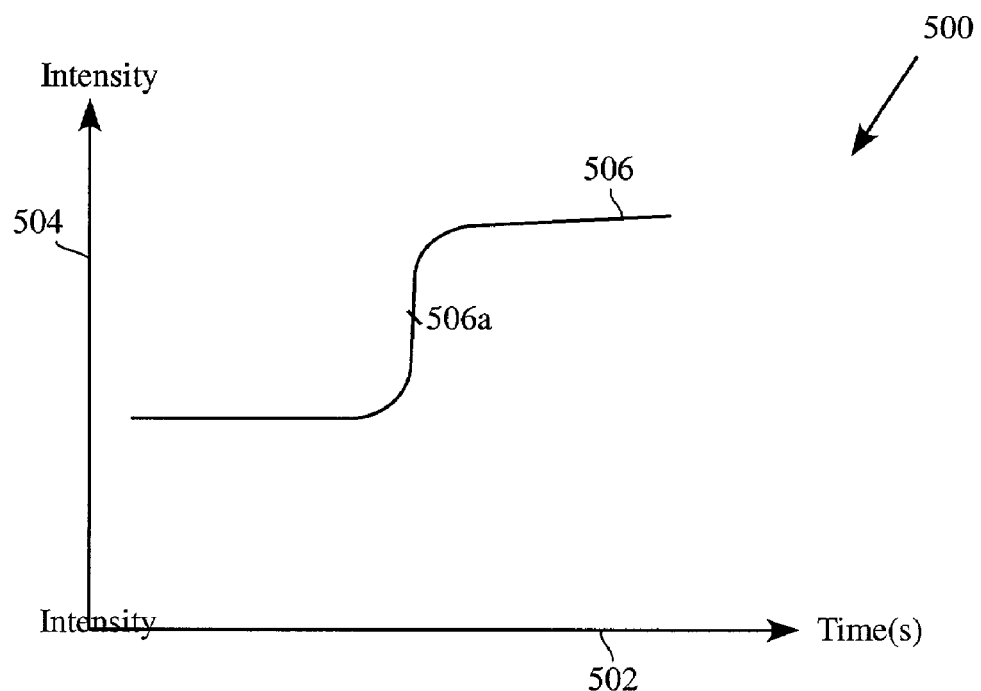
FIGS. 5B and 5C depict graphs illustrating the change in the OES emission signal within the etch chamber, in accordance with still another embodiment of the present invention.
Figure 5C:
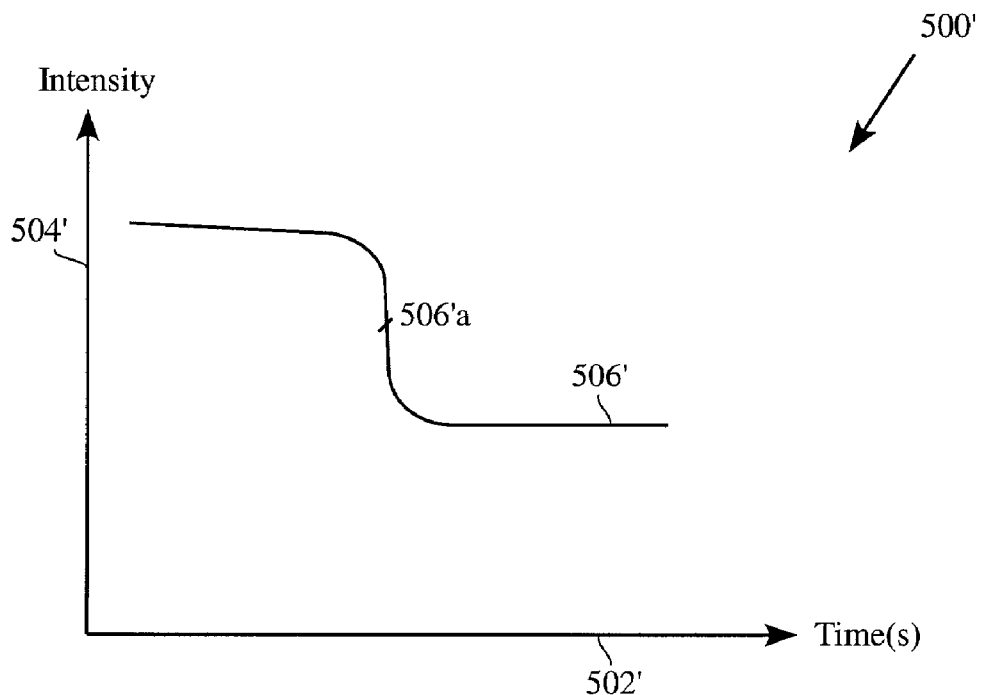

The change in the emission signal within the etch chamber as monitored by the OES can further be understood with respect to graphs 506 and 506' of the corresponding plots 500 and 500' depicted in FIGS. 5B and 5C, respectively, in accordance with one embodiment of the present invention. The illustrated plots 500 and 500' having intensity as a y-axis (i.e., 504 and 504', respectively) and time as a x-axis (i.e., 502 and 502', respectively), shows the changes in the intensity of the light emitted within the chamber as the overetch operation proceeds. As shown, at the interface of the spacer layer 108 and the underlying oxide 104, i.e., points 506a and 506a', the graph 500 rises as graph 500' plummets, signaling the end point of the over etch operation. The abrupt change in the intensity vs. time trace signals the decrease in the concentration of the spacer material and the increase in the concentration of underlying gate oxide material.

Figure 6:
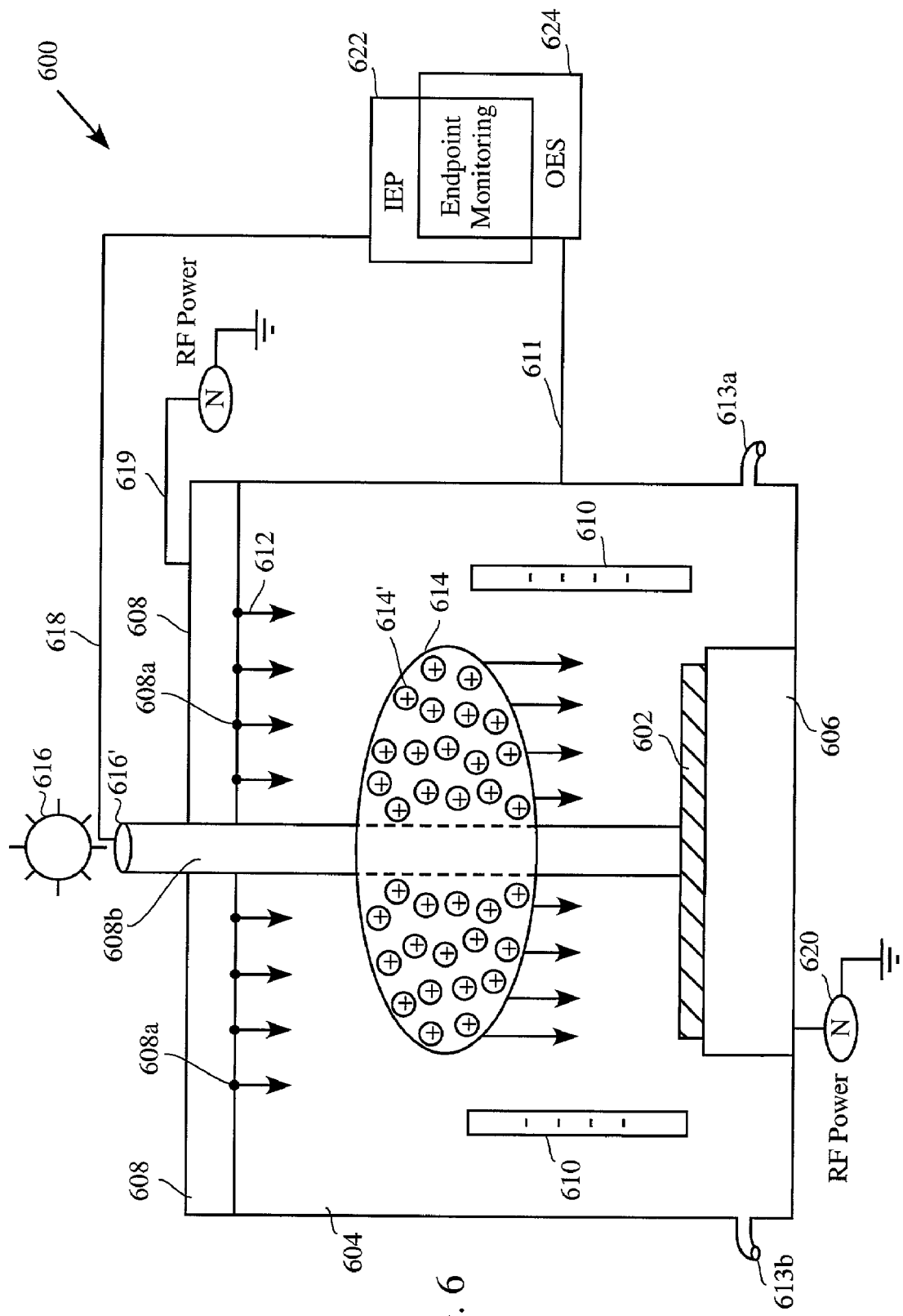
FIG. 6 is a simplified, schematic, cross sectional illustration of an exemplary in situ two-step etch processing system, in accordance with another embodiment of the present invention.

FIG. 6 is a schematic and simplified illustration of an exemplary in situ two-step etch processing system 600 configured to implement IEP etch endpoint detection method and time mode overetch method monitored by OES, in accordance with one embodiment of the present invention. The in situ two-step etch processing system 600 includes an etch chamber 604 including an electrostatic chuck (ESC) 606, a grounded radio frequency (RF) power component 618, a grounded ESC power component 620, a light source 616, an IEP endpoint monitoring circuitry 622, and an OES endpoint monitoring circuitry 624.

In accordance with one embodiment of the present invention, the etch chamber 604 includes a plurality of containment rings 610 designed to confined a plasma 612 within a plasma region 614. Additionally, the etch chamber 604 includes a center injector 608 having a plurality of holes 608a and a light aperture 608b. In another embodiment, the center injector can be configured to be a showerhead. As designed, process gases (i.e., etch chemistries) are introduced into the etch chamber 604 through the plurality of the holes 608a. In the embodiment of FIG. 6, the bias RF power component 620 coupled to the ESC 606 is configured to excite the plasma 612 from below while the RF power component 619 (TCP) is coupled to a plasma chamber top window and is configured to excite the plasma 612 from the above.

In one exemplary embodiment, the ESC 606 is monopolar electrostatic chuck having a pair of conductive portions designed to function as a positive and negative electrodes. However, in a different embodiment, a bi-polar electrostatic chuck may be implemented. Therefor, once the ESC power component 620 and the RF power component 619 are activated, thus striking the plasma 612 within the chamber 604, positive and negative potentials are induced on the respective pole of the ESC 606. As a result, electrostatic forces are generated between the positive and negative poles of the ESC 608 and the respective overlaying portion of a wafer 602. In this manner, the wafer 606 is securely held with respect to the ESC 606 during the main etch controlled by IEP and the overetch time mode monitored by OES.

As shown, a fiberoptic bundle 616' is configured to direct light from the light source 616 onto the wafer 602 through the light aperture 608b while a fiberoptic 618 is configured to receive light reflected from the wafer 602. As shown, the fiberoptic bundle 618 is coupled to the IEP endpoint monitoring component 622 so as to detect the reflected light.

As described in more detail above, in one embodiment, different process gases can be implemented during the etch operation controlled by IEP and the overetch operation monitored by OES. Additionally, the main plasma etch operation of the present invention is configured to follow a specific combination of process parameters to etch through the predetermined thickness of the nitride spacer layer (e.g., etch reactant chamber pressure, gas mixtures, gas flow rates, temperature, RF power (top and bottom), wafer position with respect to the plasma, etc.). As illustrated in Tables 1–4 below, the embodiments of the present invention additionally have been configured to function well within a broad range of each parameters and etch chemistries. For instance, as shown in Table 1, in one preferred embodiment, the combination of $C_2F_6$, $CH_2F_2$, and $O_2$ is implemented during the main etch process, IEP etch process.

TABLE 1

Exemplary IEP Etch Process First Alternative Chemistry

| Exemplary Etch Chemistry Implementing IEP Etch | First Alternative Chemistry $C_2F_6/CH_2F_2/O_2$ | | | | | | |
|---|---|---|---|---|---|---|---|
| Endpoint Detection | Top Power | Bottom Power | Flow Rates (sccms) | | | Pressure | Temp |
| Ranges | (watts) | (watts) | $C_2F_6$ | $CH_2F_2$ | $O_2$ | (mTorr) | (C.) |
| Preferred Range | 300 to 700 | 50 to 200 | 40 to 125 | 40 to 125 | 20 to 50 | 5 to 50 | 40 to 60 |
| More Preferred Range | 400 to 600 | 80 to 180 | 60 to 100 | 60 to 100 | 25 to 50 | 20 to 40 | 45 to 55 |
| Most Preferred | 480 | 100 | 75 | 75 | 30 | 30 | 50 |

In a different embodiment, as shown below in Tables 2–4, alternative etch chemistries can be implemented during the etch operation controlled by IEP.

TABLE 2

Exemplary IEP Etch Process Second Alternative Chemistry

| Exemplary Etch Chemistry Implementing IEP Etch | Second Alternative Chemistry $CF_4/CH_2F_2/O_2$ | | | | | | |
|---|---|---|---|---|---|---|---|
| Endpoint Detection | Top Power | Bottom Power | Flow Rates (sccms) | | | Pressure | Temp |
| Ranges | (watts) | (watts) | $CF_4$ | $CH_2F_2$ | $O_2$ | (mTorr) | (C.) |
| Preferred Range | 300 to 500 | 50 to 120 | 30 to 75 | 10 to 30 | 20 to 45 | 10 to 30 | 30 to 60 |

TABLE 2-continued

Exemplary IEP Etch Process Second Alternative Chemistry

Exemplary Etch Chemistry Implementing IEP Etch: Second Alternative Chemistry $CF_4/CH_2F_2/O_2$

| Endpoint Detection Ranges | Top Power (watts) | Bottom Power (watts) | Flow Rates (sccms) | | | Pressure (mTorr) | Temp (C.) |
|---|---|---|---|---|---|---|---|
| | | | $CF_4$ | $CH_2F_2$ | $O_2$ | | |
| More Preferred Range | 350 to 450 | 60 to 100 | 40 to 60 | 15 to 25 | 25 to 35 | 15 to 25 | 40 to 55 |
| Most Preferred | 400 | 80 | 50 | 20 | 30 | 20 | 50 |

TABLE 3

Exemplary IEP Etch Process Third Alternative Chemistry

Exemplary Etch Chemistry Implementing IEP Etch: Third Alternative Chemistry $HBr/SF_6/O_2$

| Endpoint Detection Ranges | Top Power (watts) | Bottom Power (watts) | Flow Rates (sccms) | | | Pressure | Temp (C.) |
|---|---|---|---|---|---|---|---|
| | | | HBr | $SF_6$ | $O_2$ | | |
| Preferred Range | 150 to 450 | 10 to 90 | 40 to 100 | 40 to 125 | 5 to 15 | 8 to 30 | 40 to 65 |
| More Preferred Range | 200 to 350 | 30 to 75 | 50 to 80 | 60 to 100 | 8 to 12 | 9 to 20 | 50 to 65 |
| Most Preferred | 250 | 60 | 65 | 80 | 10 | 10 | 65 |

TABLE 4

Exemplary IEP Etch Process Fourth Alternative Chemistry

Exemplary Etch Chemistry Implementing IEP Etch: Fourth Alternative Chemistry $CF_4/HBr/O_2$

| Endpoint Detection Ranges | Top Power (watts) | Bottom Power (watts) | Flow Rates (sccms) | | | Pressure (mTorr) | Temp (C.) |
|---|---|---|---|---|---|---|---|
| | | | $CF_4$ | HBr | $O_2$ | | |
| Preferred Range | 600 to 1000 | 40 to 80 | 60 to 200 | 30 to 90 | 3 to 10 | 10 to 30 | 20 to 50 |
| More Preferred Range | 700 to 900 | 50 to 70 | 80 to 150 | 40 to 70 | 5 to 10 | 15 to 25 | 20 to 35 |
| Most Preferred | 800 | 60 | 100 | 50 | 3 | 20 | 20 |

It must be noted that the light source 616 can be any appropriate light source (e.g., tungsten halogen lamp, mercury lamp, a xenon lamp, etc.). For instance, the wavelengths implemented in a tungsten halogen lamp is between approximately about 400 nm and approximately about 850 nm. Likewise, the wavelengths implemented in a mercury-Argon lamp is between approximately about 254 nm and approximately about 850 nm. Similarly, the wavelengths implemented in a xenon lamp is between approximately about 250 nm and approximately about 850 nm, and more preferably between approximately about 250 nm and approximately about 650 nm.

The IEP endpoint monitoring component 622 can be any appropriate apparatus having a detector capable of identifying a broad spectrum of wavelengths reflected from the wafer 602. Additionally, the suitable IEP endpoint monitoring component 622 may include a suitably programmed computer having peripheral devices (e.g., input devices, output devices, etc.) capable of receiving and analyzing data received by its detector component. Furthermore, although in this embodiment the detector is configured to be a component of the IEP endpoint monitoring component 622, in a different embodiment, detector components and programmed computer systems can be implemented separately. Additionally, although in this embodiment fiberoptic 616' and 618 have been implemented to direct light from the light source onto the wafer and to direct reflected light to the detector component of IEP endpoint monitoring component 622, respectively, in a different embodiment, any appropriate mechanism capable of performing these functions can be implemented (e.g., a combination of reflecting mirrors, etc.).

Upon IEP endpoint monitoring component 622 detecting the removal of the required thickness of the layer being etched (e.g., the silicon nitride spacer material), the etching operation is terminated, leaving a thin layer of the spacer layer having substantially the same thickness through out the wafer surface. Then, the contents of the etch chamber 604 (e.g., plasma 612, polymers, by-products, etc.) are then released from the etch chamber 604 implementing a plurality of well known exhaust pipes 613a and 613b.

Upon releasing the contents of the etch chamber 604, a second process gas is introduced into the etch chamber 604 through the holes 608a of the showerhead 608. Again, by powering up the ESC 606 and the showerhead 608 the second plasma is ignited, initiating the second etch operation. At this point, the OES endpoint monitoring component 624 is implemented to monitor the endpoint of the second etch operation directed toward removing the thin layer of nitride remaining on the surface of the wafer 602. In one example, the overetch is continued for a predetermined period of time as the overetch process is monitored by OES.

By way of example, the change in the intensity of light emitted by the second plasma defined within the etch chamber 604 changes as the concentration (i.e., the thickness) of the nitride spacer layer decreases within the chamber 604.

In the embodiment of FIG. 6, a fiberoptic bundle 611 defined between the etch chamber 604 and the OES detector component defined within the OES monitoring component 624 is implemented to conduct the light emitted by the plasma to the OES detector, in which the emitted light is detected. As the etch operation proceeds and as the predetermined time approaches, the concentration of the material being etched (e.g., nitride) within the etch chamber 604 decreases causing the OES detector component detecting an abrupt falling or rising of the OES signal, indicating the end of the second etch process (e.g., overetch).

As stated in more detail above, the plasma each process of the present invention is configured to follow a specific combination of process parameters so as to etch through the remaining thin spacer layer (e.g., etch reactant chamber pressure, gas mixtures, gas flow rates, temperature, RF power (top and bottom), wafer position with respect to the plasma, etc.). As illustrated in Tables 5–6, the embodiments of the present invention have been configured to function well within a broad range of each parameter. For instance, as shown in Table 5, in one exemplary embodiment, a highly selective chemistry (e.g., a combination of $C_2F_6$, $CH_2F_2$, and $O_2$) can be implemented to etch the thin layer of nitride spacer layer.

TABLE 5

Exemplary Overetch Etch Chemistry

| Exemplary Overetch Etch Chemistry | Top Power | Bottom Power | Flow Rats (sccms) | | | Pressure | Temp |
|---|---|---|---|---|---|---|---|
| Highly selective Chemistry $C_2F_6/CH_2F_2/O_2$ | | | | | | | |
| Ranges | (watts) | (watts) | $C_2F_6$ | $CH_2F_2$ | $O_2$ | (mTorr) | (C.) |
| Preferred Range | 200 to 500 | 0 to 60 | 12 to 30 | 35 to 90 | 30 to 80 | 50 to 90 | 40 to 65 |
| More Preferred Range | 250 to 400 | 0 to 30 | 15 to 25 | 50 to 75 | 40 to 60 | 60 to 90 | 50 to 65 |
| Most Preferred | 300 | 0 | 20 | 60 | 50 | 80 | 60 |

However, in a different embodiment, as shown in Table 6, a chemistry having an alternative high level of selectivity toward the underlying polysilicon layer and oxide layer can be implemented to etch the thin layer of nitride spacer layer.

TABLE 6

Exemplary Overetch Process Etch Chemistry

| Exemplary Overetch Process Etch Chemistry | Top Power | Bottom Power | Flow Rates (sccms) | | | Pressure | Temp |
|---|---|---|---|---|---|---|---|
| Chemistry with medium level of selectivity $O_2/HBr/SF_6$ | | | | | | | |
| Ranges | (watts) | (watts) | $O_2$ | HBr | $SF_6$ | (mTorr) | (C.) |
| Preferred Range | 300 to 900 | 0 to 50 | 10 to 35 | 40 to 130 | 10 to 40 | 50 to 90 | 20 to 40 |

TABLE 6-continued

Exemplary Overetch Process Etch Chemistry

| Exemplary Overetch | Chemistry with medium level of selectivity $O_2/HBr/SF_6$ | | | | | |
|---|---|---|---|---|---|---|
| Process Etch Chemistry | Top Power | Bottom Power | Flow Rates (sccms) | | | Pressure | Temp |
| Ranges | (watts) | (watts) | $O_2$ | HBr | $SF_6$ | (mTorr) | (C.) |
| More Preferred Range | 500 to 900 | 0 to 30 | 15 to 30 | 55 to 100 | 15 to 35 | 65 to 85 | 20 to 30 |
| Most Preferred | 900 | 0 | 20 | 75 | 25 | 80 | 20 |

Figure 7:
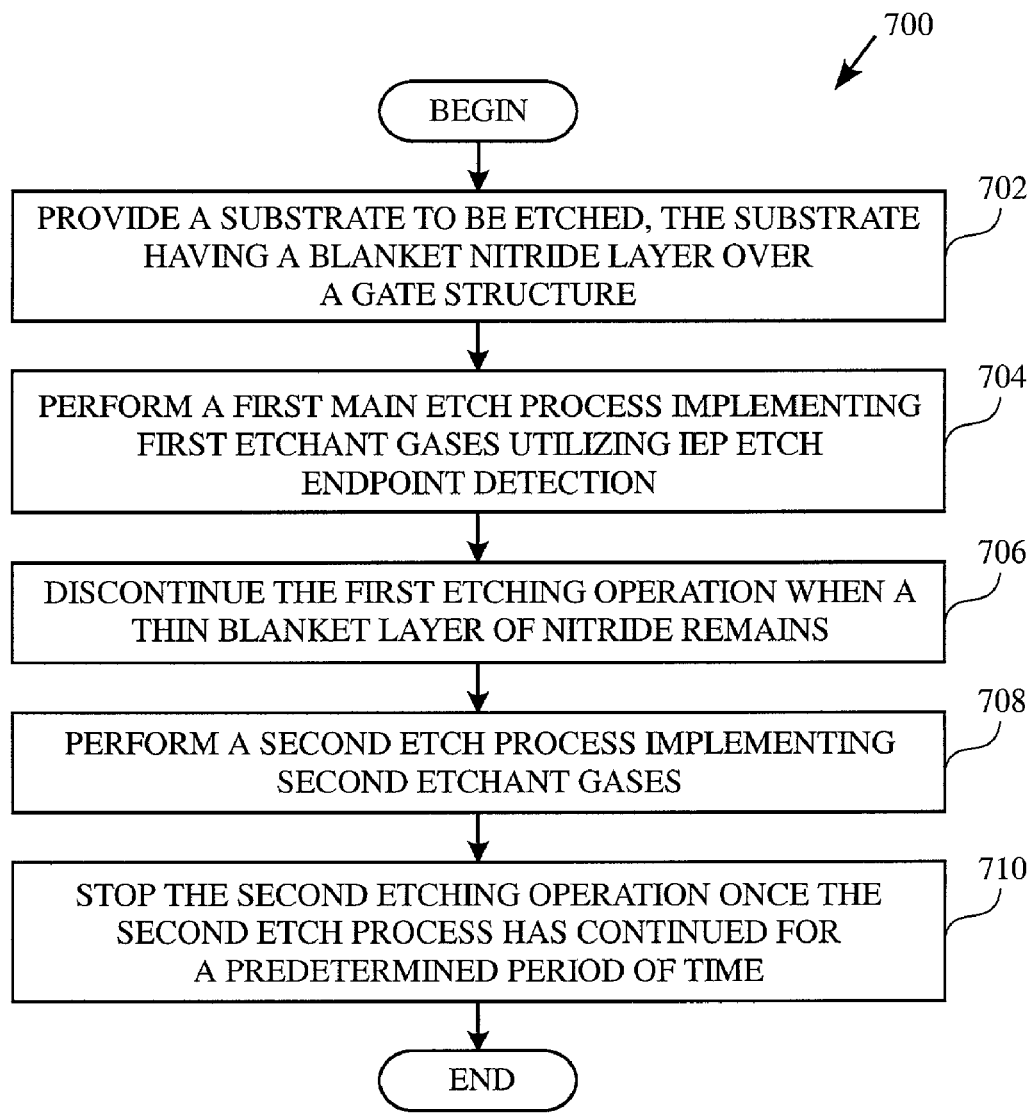
FIG. 7 is a flowchart diagram illustrating method operations performed in an in situ dual etch processor, in accordance with yet another embodiment of the present invention.

Reference is made to a flow chart diagram 700 of FIG. 7 illustrating method operations performed in an in situ dual etch processor configured to substantially precisely control etch endpoint detection, in accordance with one embodiment of the present invention. The method begins in operation 702 in which a substrate having a blanket nitride layer to be etched is provided. The blanket nitride layer overlies a gate structure, which in one embodiment includes a gate oxide layer and a polysilicon layer. Then, in operation 704, a first main etch process implementing first etchant gases is performed. The main etch process is configured to implement the IEP etch endpoint detection method to control the removal of the nitride layer during the main etch process thus keeping the thickness of the remaining nitride thickness uniform through out the surface of the wafer. By way of example, the main etch process can be configured to implement a combination of $C_2F_6$, $CH_2F_2$, and $O_2$, $C_2F_6$, $CH_2F_2$, and $O_2$, HBr, $SF_6$, and $O_2$, or $CF_4$, HBr, and $O_2$ as etchant gases. In this manner, beneficially, the substantially aggressive main etch operation can precisely control the removal of the nitride material as the etch operation proceeds.

Continuing to operation 706, the first etching operation is discontinued by IEP control when a thin blanket layer of nitride remains. By way of example, as described in more detail above, the thickness of the nitride layer to be removed (e.g., etch depth) can be calculated by counting interference fringes at a particular wavelength. In one embodiment, the thickness of the blanket layer of nitride remaining upon the conclusion of the first main etch process is configured to be from approximately about 50 Å to approximately about 300 Å, and preferably ranging from approximately about 100 Å to 200 Å, and preferably approximately about 100 Å.

Proceeding to operation 708, a second etch process (i.e., the overetch) is performed implementing a combination of second etchant gases monitored by a non-IEP etch endpoint detection method. For instance, in one preferred embodiment, the second etch process is a time mode etch process. In another example, the overetch operation implementing the time mode method is monitored by OES. However, in a different example, the overetch time mode etch process can be monitored by any appropriate non-IEP etch endpoint monitoring suitable for detecting the etch endpoint of a substantially thin blanket layer of nitride (e.g., capacitance tune setting change, etc.).

Preferably, the overetch (i.e., the second etch process) implements a combination of etchant gases having substantially a high selectivity toward the top SiN material and not the underlying layer (i.e., silicone oxide material of the gate oxide (e.g., $HBr/O_2/SF_6$, etc.) and polysilicon material of the polysilicon gate (e.g., $CH_2F_2/C_2F_6/O_2$, etc.). As is well known, the high selectivity of the etchant gases will result in the removal of the nitride layer while having substantially minimal effect on the underlying material. By of example, the highly selective etchant gases can be the combination of $C_2F_6$, $CH_2F_2$, and $O_2$. In a different implementation, the overetch etch process may implement the etchant gases configured to have medium selectivity toward the underlying layer. In one implementation, the medium level etchant gases implemented is a combination of $O_2$, HBr, and $SF_6$.

Moving to operation 710, the overetch (i.e., second etch) operation is stopped when the overetch operation has continued for a predetermined period of time. In one embodiment, the overetch operation is monitored by a non-IEP etch endpoint detection method. In one embodiment, the non-IFP etch endpoint detection method is OES. When the overetch operation is monitored by OES, the decrease in the intensity of the light emitted by the nitride being removed produces a distinguishable change. In one example, this distinguishable change is a fall or a rise in the intensity of light emitted. In a different embodiment, for instance, where the second etch operation is monitored by bias compensated etch endpoint detection method, the distinguishable change is a previously ascertained and anticipated step increase or decrease in the voltage.

Figure 8:
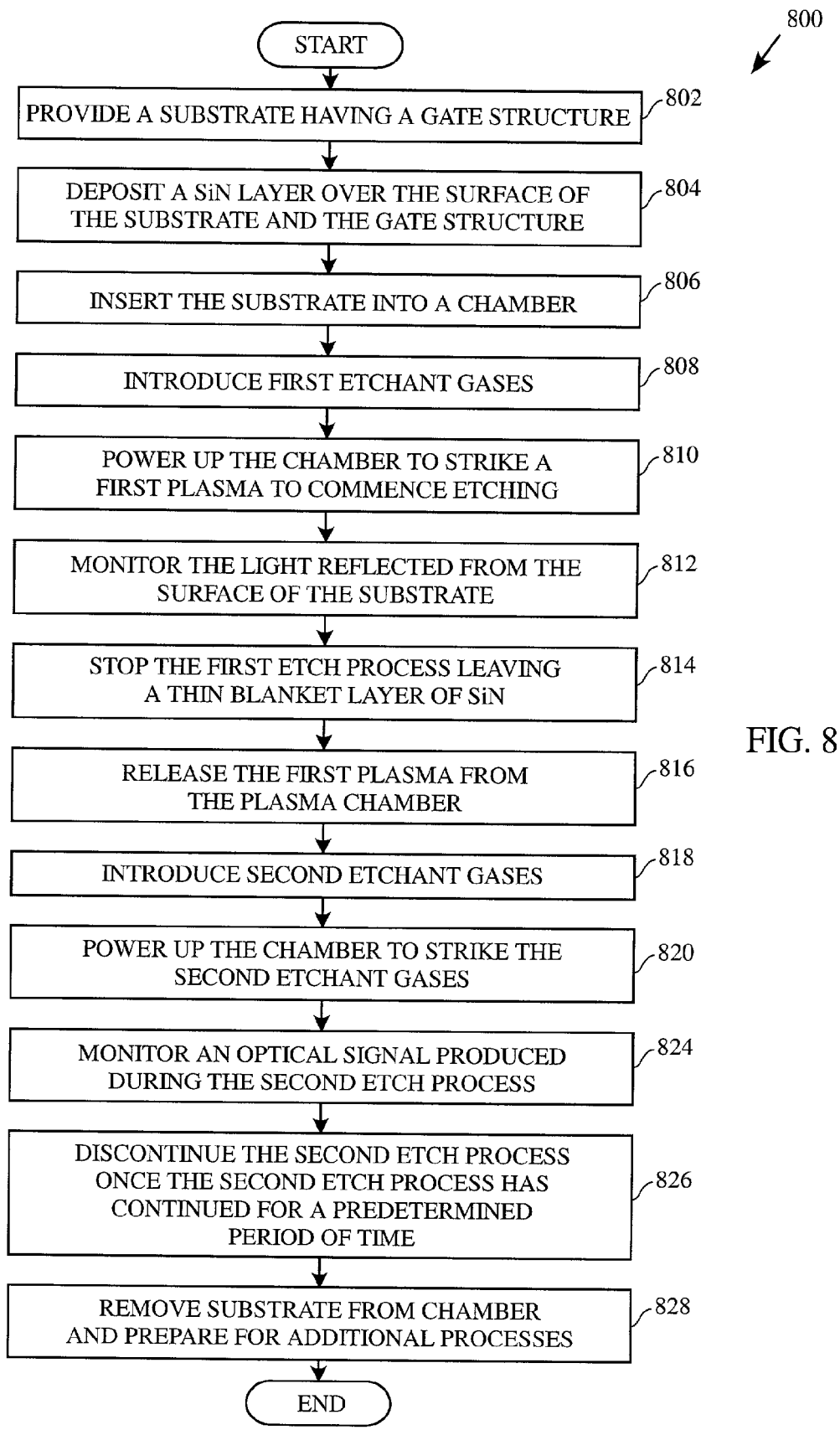
FIG. 8 is a flowchart diagram illustrating method operations performed in an in situ dual etch processing system implementing IEP etch endpoint detection method to control the main etch while implementing the OES method to monitor the overetch, in accordance with still another embodiment of the present invention.

The method operations performed in an in situ dual etch processing system implementing IEP etch endpoint detection method during the main etch operation and the time mode during the overetch operation can further be understood with reference to a flow chart diagram 800 of FIG. 8, in accordance with one embodiment of the present invention. The method beings with operation 802 in which a substrate having a gate structure is provided. The gate structure, as discussed in more detail above, includes a polysilicon gate formed over a gate oxide. Next, in operation 804, a SiN layer is deposited over the surface of the substrate and the gate structure. In one embodiment, the SiN layer is formed implementing the CVD deposition technique. Thereafter, the substrate is inserted into an etching chamber.

Moving to operation 808, first etchant gases are introduced into the etching chamber. As was described in more detail above, in one example, the etchant gases are introduced into the etch chamber implementing a showerhead (or a gas injector) defined within the etch chamber. Additionally, the first etchant gases are selected so as to perform a substantially aggressive etching operation. For instance, as the first etch operation is configured to implement IEP etch endpoint detection method, in one preferred embodiment, the first etchant gases is the combination of $C_2F_6$, $CH_2F_2$, and $O_2$. In alternative implementations, the combination of $CH_2F_2$, and $O_2$, HBr, $SF_6$, and $O_2$, or $CF_4$, HBr, and $O_2$ can be implemented as first etchant gases. By way of example, where the preferred combination of first etchant gases is implemented, first, a flow rate of $C_2F_6$ is set followed by setting a flow rate level of $CH_2F_2$. Finally, the flow rate level of oxygen is set. The broad range, more preferred range, and the most preferred flow rates for each of the gases have been shown above in Tables 1–4.

Subsequently, the etch chamber is powered up so as to strike a first plasma, commencing the first etching operation. In one example, a top electrode power and a bottom electrode power are set, respectively. As discussed in more detail above, each of the top and bottom electrodes are coupled to a radio frequency (RF) power. Then, a pressure level is set. Beneficially, the embodiments of the present invention have the capability to perform the etch operation so as to produce spacers that are laterally smoother. In one example, this task is achieved by decreasing the power supplied to the bottom electrode. In this manner, in one example, depending on the properties of the layer being etched and the etch chemistry, the etch operation component of the process over comes the deposition component, thus minimizing spacer build up.

Moving to operation 812, the light reflected from the surface of the substrate is monitored. In one example, this is achieved by a photodetector monitoring the portion of the photon beam directed onto the surface of the substrate. For each wavelength, a distance between adjacent maximum or minimum fringes is used to measure a thickness of the nitride layer, as the nitride material is being removed. In this manner, the progress of the first etch operation is monitored simply by observing and counting the number of sinusoidal cycles. Next, in operation 814, the first etch process is stopped leaving a thin blanket layer of SiN. In this manner, by implementing IEP etch endpoint detection method, a substantially aggressive first etch operation can be implemented to substantially precisely control the etch process without having to concerned with the problem of gate oxide punch through, associated with the prior art. Thereafter, in operation 816, the first plasma is released from the plasma chamber.

In the subsequent operation 818, the second etchant gases are introduced within the etch chamber. As in one embodiment, the second etch operation implements OES etch endpoint detection method to monitor the etch endpoint, preferably, highly selective etchant gases are implemented to remove the remaining thin layer of SiN. However, depending on the process parameters, a medium selectivity etchant gases can be implemented.

Next, in operation 820, the etch chamber is powered up, striking the second etchant gases. As discussed in more detail, the powering up of the etch chamber involves setting a level for the top electrode and the bottom electrode as well as setting the pressure level. In this manner, beneficially, the shape of the SiN spacers can be controlled substantially precisely by changing the level of the bottom electrode, for instance.

Moving to operation 824, an optical signal produced during the second etch process is monitored. As was explained in more detail above, the intensity of the optical signal detected is substantially directly proportional to the concentration of the material (e.g., SiN) being etched. Thus, as the thin layer of the SiN is being removed, the concentration of the SiN decreases within the etch chamber, signaling the fast approaching endpoint of the second etch operation. Next, in operation 826, the second etch process is discontinued once the second etch operation has continued for a predetermined period of time. In one example, before the second etch operation is discontinued, a distinguishable OES signal may be detected. In one example, the OES distinguishable change is a fall in the intensity vs. time traces whereas in a different example, the change is a rise in the trace. Then, in operation 828, the substrate is removed from the etch chamber and is prepared for additional processes.

Although in this embodiment the second etch operation implements time mode to stop the overetch process, in a different embodiment any suitable method can be implemented to detect the overetch endpoint (e.g., capacitance change, etc.) Additionally, although in this embodiment, OES method has been implemented to monitor the overetch process, in a different embodiment any suitable etch endpoint monitoring system may be implemented (e.g., bias voltage change, etc.). Furthermore, in different etch endpoint monitoring systems, the etch endpoint change may be evidenced by any distinguishable signal. Additionally, it must be appreciated that irrespective of the shape of the signal, the end of each of the etch processes are evidenced with a distinct change in the shape of the intensity vs. time trace. Thus, performing sample etching operations on sample substrates can be used to determine the specific number of sinusoidal cycles for the IEP etch endpoint detection method as well as the period of time to perform the overetch operation and the characteristics and shape of the OES etch endpoint monitoring signal. In this manner, the IEP endpoint monitoring systems can be instructed to search for the predetermined number of sinusoidal cycles, the predetermined length of time for overetching, and the ascertained characteristic and shape in the OES trace so as to define the etch endpoint for each stage.

Although the foregoing invention has been described in some detail for purposes of clarity of understanding, it will be apparent that certain changes and modifications may be practiced within the scope of the appended claims. For example, embodiments described herein can be directed toward fabricating semiconductor structures having any type of metallization lines (e.g., copper, aluminum, tungsten and other metals or alloys). Additionally, although the following parameters are associated with an exemplary "8-inch wafer," the parameters may be modified for application to substrates of varying sizes and shapes such as those employed in the manufacture of semiconductor devices and flat panel displays. Accordingly, the present embodiments are to be considered as illustrative and not restrictive, and the invention is not to be limited to the details given herein, but may be modified within the scope and equivalents of the appended claims.

What is claimed is:

1. A method for fabricating a spacer of a gate structure, the method comprising:
    performing a first etch process implementing a first etchant gas, the first etch process configured to remove a portion of a spacer layer, leaving a thin spacer layer, the first etch process configured to implement an interferometry endpoint (IEP) detection method to detect the removal of the portion of the spacer layer; and
    performing a second etch process implementing a second etchant gas, the second etch process including monitoring by a non-IEP etch endpoint process, the second etch process configured to remove the thin spacer layer, leaving the spacer for the gate structure,
    wherein the second etchant gas includes a combination of $O_2$, HBr, and $SF_6$.

2. The method as recited in claim 1, wherein the first etchant gas includes a combination of $C_2F_6$, $CH_2F_2$, and $O_2$, a combination of $CF_4$, $CH_2F_2$, and $O_2$, or a combination of $CF_4$, HBr, and $O_2$.

3. The method as recited in claim 1, further comprising:
discontinuing the first etch process upon removing the portion of the spacer layer, leaving the thin spacer layer.

4. The method as recited in claim 1, further comprising:
discontinuing the second etch process in response to monitoring the removal of the thin spacer layer by the non-IEP etch endpoint process and when the second etch process has continued for a predetermined period of time.

5. The method of claim 1, wherein the IEP etch endpoint monitoring method is configured to monitor a photon beam reflected by the spacer layer so as to determine the thickness of an etch depth during the first etch operation implementing a distance between consecutive maximum intensities.

6. The method of claim 5, wherein the non-IEP etch endpoint monitoring method is optical emission spectroscopy (OES).

7. The method of claim 1, wherein the spacer layer is a nitride layer.

8. A method for fabricating a silicon nitride spacer, the method comprising:
performing a first etch process implementing a first etchant gas in a plasma chamber, the first etch process configured to control a removal of a portion of a silicon nitride layer from over a surface of a substrate by monitoring a light reflected by the silicon nitride layer, the first etch process further configured to leave a thin silicon nitride layer over the surface of the substrate and to maintain a thickness of the thin silicon nitride layer substantially uniform throughout the surface of the substrate and a gate structure formed thereon, the first etchant gas configured to include a combination of $CF_4$, HBr, and $O_2$; and
performing a second etch process implementing a second etchant gas, the second etch process including monitoring an optical signal produced by a second plasma during the second etch operation, the second etch process configured to remove the thin silicon nitride layer, leaving the silicon nitride spacer for the gate structure.

9. The method as recited in claim 8, further comprising:
purging a first plasma content defined within the plasma chamber.

10. The method as recited in claim 8, wherein the second etch process is performed for a predetermined period of time.

11. The method as recited in claim 8, wherein the first etch operation and the second etch operation are performed in situ.

12. The method as recited in claim 8, wherein monitoring the light reflected by the silicon nitride layer includes,
directing a photon beam onto the silicon nitride layer;
observing a reflected photon beam reflected by the silicon nitride layer; and
determining an etch depth as the first etch operation proceeds.

13. The method of claim 12, wherein determining the etch depth includes:
monitoring an intensity of the reflected photon beam;
determining a distance between a pair of consecutive maximum intensities; and
determining the thickness of the etch depth implementing the distance between consecutive maximum intensities.

14. The method as recited in claim 8, wherein the second etchant gas includes a combination of $C_2F_6$, $CH_2F_2$, and $O_2$, or a combination of $O_2$, HBr, and $SF_6$.

15. A method for fabricating a nitride spacer of a gate structure, the method comprising:
performing a first etch process using a first etchant gas, the first etch process implementing an interferometry endpoint (IEP) detection process to detect a removal of a portion of a nitride spacer layer;
discontinuing the first etch process upon removing the portion of the nitride spacer layer, leaving a thin nitride spacer layer;
performing a second etch process using a second etchant gas implementing optical emission spectroscopy (OES) endpoint monitoring process, the second etch process configured to remove the thin nitride spacer layer, leaving the nitride spacer for the gate structure; and
discontinuing the second etch process in response to the OES monitoring process,
wherein the first etchant gas includes a combination of $C_2F_6$, $CH_2F_2$, and $O_2$ and the second etchant gas includes a combination of $O_2$, HBr, and $SF_6$, the first etchant gas includes a combination of $CF_4$, $CH_2F_2$, and $O_2$ and the second etchant gas includes a combination of $O_2$, HBr, and $SF_6$, the first etchant gas includes a combination of $CF_4$, HBr, and $O_2$ and the second etchant gas includes a combination of $C_2F_6$, $CH_2F_2$, and $O_2$, or the first etchant gas includes a combination of $CF_4$, HBr, $O_2$ and the second etchant gas includes a combination of $O_2$, HBr, and $SF_6$.

16. The method of claim 15, wherein a thickness of the thin nitride spacer layer is configured to range between approximately about 50 Å and 300 Å.

17. The method of claim 15, wherein a thickness of the thin nitride layer is configured to range between approximately about 100 Å and 200 Å.

18. The method of claim 15, wherein a thickness of the thin nitride spacer layer is configured to be about 100 Å.

* * * * *